United States Patent [19]

Amaya et al.

[11] 4,207,529

[45] Jun. 10, 1980

[54] RADIO RECEIVER

[75] Inventors: Yuji Amaya; Tatsuo Ito, both of Kobe, Japan

[73] Assignee: Fujitsu Ten Limited, Japan

[21] Appl. No.: 783,060

[22] Filed: Mar. 30, 1977

[30] Foreign Application Priority Data

Apr. 8, 1976 [JP] Japan .................................. 51/39648
Apr. 8, 1976 [JP] Japan .................................. 51/39649
Apr. 9, 1976 [JP] Japan .................................. 51/40024

[51] Int. Cl.² ........................ H04B 1/26; H04B 1/32
[52] U.S. Cl. ............................ 455/158; 455/169; 455/184
[58] Field of Search ............ 325/464, 470, 335, 453, 325/459, 419, 420, 422, 423, 455

[56] References Cited

U.S. PATENT DOCUMENTS

| | | | |
|---|---|---|---|
| 3,467,870 | 9/1969 | Aoyama | 325/470 |
| 3,943,449 | 3/1976 | Hendrickson et al. | 325/420 |
| 3,956,702 | 5/1976 | Tanaka | 325/464 |
| 3,988,681 | 10/1976 | Schürmann | 325/470 |
| 4,004,232 | 1/1977 | Amaya | 325/464 |
| 4,023,108 | 5/1977 | Torii | 325/464 |
| 4,053,838 | 10/1977 | Amaya | 325/470 |
| 4,070,629 | 1/1978 | Merrell | 325/464 |
| 4,110,695 | 8/1978 | Klank et al. | 325/464 |

*Primary Examiner*—Marc E. Bookbinder
*Attorney, Agent, or Firm*—Staas & Halsey

[57] ABSTRACT

An AM/FM receiver provided with a frequency divider for frequency dividing the output frequency of a local oscillator to provide a count output which starts with "1" at the lower limit of a receiving frequency band and thereafter increases its count value for each constant frequency band (as the receiving frequency band is searched), a digital setter for setting a desired receiving frequency, and a comparator supplied with the outputs from the frequency divider and the digital setter to produce an output for gradually increasing or decreasing the output frequency of the local oscillator until the outputs from the frequency divider and the comparator come to coincide with each other. A desired broadcasting wave is automatically tuned with such a simple construction.

22 Claims, 12 Drawing Figures

RADIO RECEIVER

BACKGROUND OF THE INVENTION

1. Field of the Invention

This invention relates to a receiver which performs tuning by a digital designation of a receiving frequency in the case of receiving a broadcast of a desired broadcasting station.

2. Description of the Prior Art

In an AM/FM radio receiver of the type performing a tuning operation by changing at least the local oscillation frequency with a control voltage, there is no need of such a mechanical operation as turning a variable condenser as is required in prior art receivers. With such an arrangement that the abovesaid control voltage is generated by a sweep voltage generator to stop a frequency search upon reception of a desired receiving frequency, that is, a desired broadcasting signal, purely electronic control of tuning is possible, and if a digital setter for designating the receiving frequency and a comparator are provided, detection of the desired frequency and storing of the search operation (that is, tuning) be achieved automatically. In other words, a desired broadcasting station can be tuned only by changing the set value of the digital setter.

For the digital designation of the receiving frequency, it is possible to represent the broadcasting frequency directly with a BCD (Binary Coded Decimal) code. However, such a system requires 12 or 10 bits, and hence introduces complexity in the comparator, the frequency setter and so on.

Further, an electronic tuning operation is made possible by using, as the local oscillator, a voltage-controlled oscillator which changes its oscillation frequency with a control voltage. The control voltage may be produced as by a variable resistor. Furthermore, use, made of a voltage memory device, that is, an element which has an integrating function and which when supplied with a positive or negative voltage, gradually increases or decreases its output. Further, the arrangement can be such that, upon removing the input voltage or causing it to fall to zero, the aforementioned element holds the present output voltage for a long time. In this way, a control voltage can easily be obtained which is continuously varied only by the application of such a positive or negative voltage and holds a desired value. In this case, however, simplification of means for applying the designating voltage to the voltage memory device and auto repeat of the tuning operation present problems.

Moreover, in the prior art receiver, muting is effected by a method of actuating a switching element at the level of an IF (intermediate frequency) signal to turn on and off an audio signal. This method is sufficient for manual operation or search-type auto tuning, but in a receiver which has a plurality of tuning functions or is capable of digital setting of a desired receiving frequency, such as an electronic tuning receiver, it is difficult to set muting only at the level of the IF signal. For example, in digital setting, where a plurality of broadcasting stations are met while searching from a station A to B, muting set only with the IF signal may be interrupted at the frequencies of the plurality of broadcasting stations in some cases.

SUMMARY OF THE INVENTION

One object of this invention is to provide a receiver which enables digital setting of a receiving frequency with a small number of bits but is simple and inexpensive.

Another object of this invention is to provide a receiver which is capable of achieving tuning accurately and quickly by changing the searching speed so that, before the tuning point is approached, the searching speed is high but, when the tuning point is approached, the speed is reduced or made lower.

Another object of this invention is to provide an auto tuner of the electronic control type which has simple means for applying a designating voltage to a voltage memory device for generating a control voltage, that is, a receiving frequency sweep voltage, and a circuit which, when the upper or lower limit of a broadcasting frequency is reached, automatically inverts its output voltage to enable a search in the reverse direction.

Still another object of this invention is to provide a circuit which ensures the ability to prevent interruption of muting also in the case of digital setting by the use of a signal other than the IF signal.

The abovesaid objects are accomplished by a receiver which has a frequency divider for frequency dividing the output frequency of a local oscillator of the receiver to produce a count output which starts with "1" at the lower limit of a broadcasting frequency band and thereafter increases its count value every constant frequency band (as the receiving frequency band is searched), a digital setter for setting a desired receiving frequency, and a comparator supplied with the outputs from the frequency divider and the digital setter to produce an output for gradually increasing or decreasing the output frequency of the local oscillator until the outputs from the frequency divider and the digital setter come to coincide with each other; an auto tuner for a receiver in which a control voltage is applied to a variable reactance element of a tuning circuit to search the receiving frequency, the control voltage being derived from a voltage memory device which produces an output varying so as to rise or drop according to a positive or negative input voltage and in proportion to the time of application of the input voltage, the abovesaid auto tuner comprising a first control circuit whose output state is inverted by an upward search control switch and a downward search control switch to control the input voltage to the voltage memory device, a second control circuit whose output state is inverted to cut off the output from the first control circuit when a broadcasting signal is received, and first and second switching circuits which are closed to invert the output from the first control circuit to reverse the direction of search when the search gets out of the upper or lower limit of the broadcasting frequency band; and a muting circuit for a receiver which has a digital comparator for comparing the receiving frequency and the desired broadcasting frequency with each other to produce a digital tuning instruction signal, and a control circuit whose output state is inverted by the operation of an upward search control switch and a downward search control switch to produce a search tuning instruction signal, the abovesaid muting circuit comprising a gate circuit for producing an output while either the digital comparator or the control circuit produces the instruction signal, and a switching circuit actuated by the output from the gate circuit to cut off an audio signal.

DESCRIPTION OF THE PREFERRED EMBODIMENTS

Figure 1:
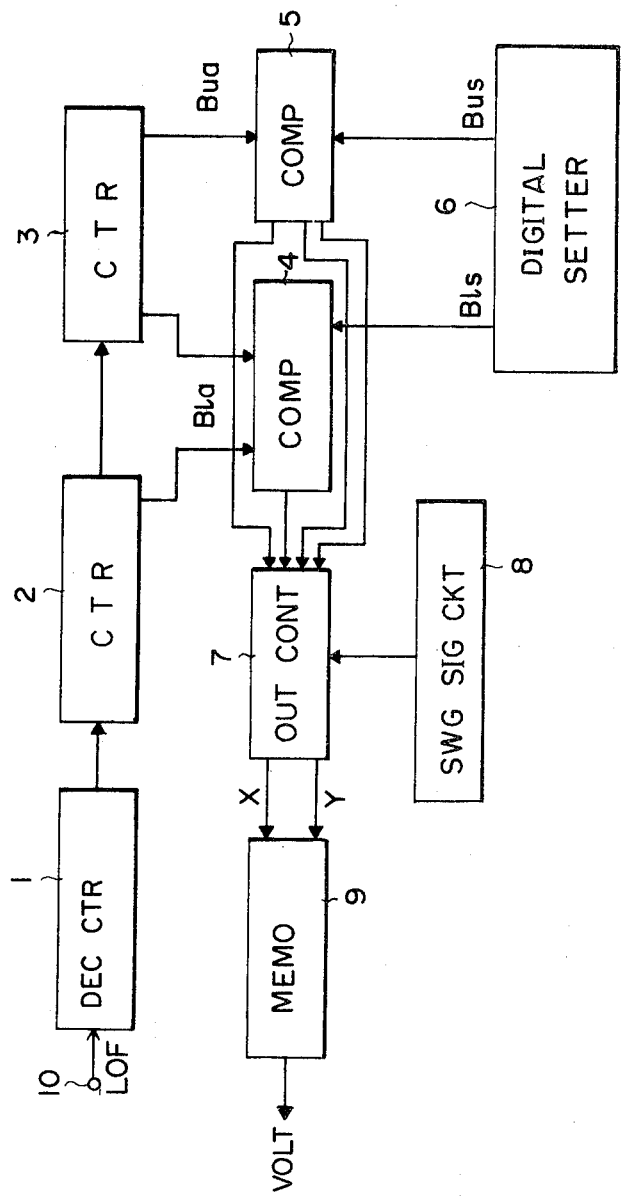
FIG. 1 is a block diagram showing an embodiment of this invention.

FIG. 1 illustrates the construction of the principal part of a receiver embodying this invention. Reference numeral 10 indicates an input terminal, to which is applied a local oscillation frequency LOF of an AM or FM receiving unit; 1 designates a decimal counter (DEC CTR), which frequency divides the input frequency down to 1/10; 2 identifies a counter (CTR) which is switched to the ternary operation during AM reception and the quaternary operation during FM reception; and 3 denotes a presettable counter (PRE CTR) in which a complement of the pulse count value from zero to the broadcasting frequency band is preset so that it does not produce a count "1" until the broadcasting frequency band is reached. Reference numerals 4 and 5 represent comparators (COMP) which are respectively supplied with high-order and low-order bit groups Bus and Bls of the BCD value of a desired broadcasting frequency set in a digital setter 6 and high-order and low-order bit groups Bua and Bla of the received broadcasting frequency from the counters 2 and 3, and which compare the abovesaid high-order and low-order bit groups with each other to apply the compared outputs to an output controller (OUT CONT) 7. Reference numeral 9 shows a voltage memory device (MEMO), which is known to have such a function that, when it is supplied with a positive or negative voltage from the output controller 7, it provides a voltage (VOLT) varying so as to rise or drop in proportion to the input time, and which also stores the output voltage for a long time when the input voltage is removed.

Figure 2:
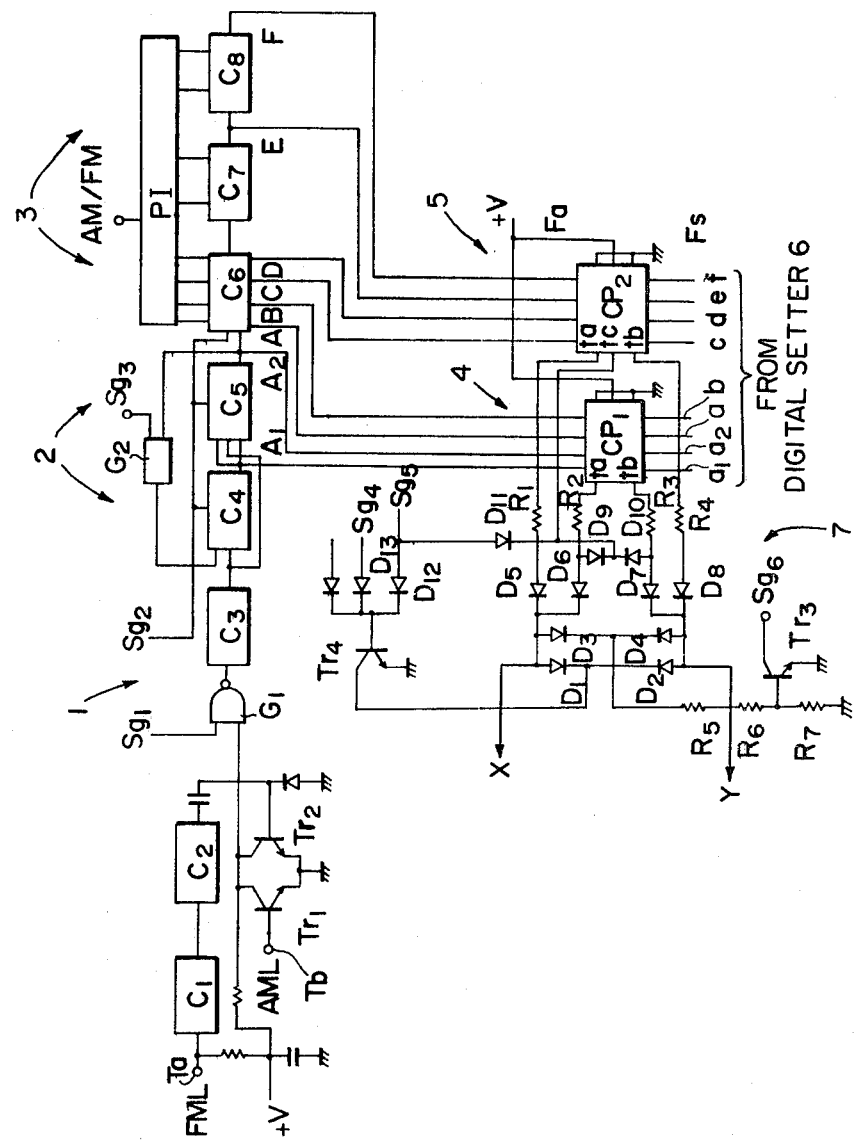
FIG. 2 is a circuit diagram illustrating in detail the circuit of FIG. 1.

FIG. 2 shows in detail the principal part of FIG. 1. In FIG. 2, reference characters $C_1$ to $C_8$ refers to counters, the counters $C_3$, $C_4$ and $C_5$, and $C_6$ to $C_8$ corresponding to the counters 1, 2, and 3 in FIG. 1, respectively. Reference characters $CP_1$ and $CP_2$ indicate comparators, which correspond to the comparators 4 and 5 in FIG. 1, respectively. The output controller 7 in FIG. 1 comprises many diodes $D_1$ to $D_{11}$, resistors $R_1$ to $R_7$ and transistors $Tr_3$ and $Tr_4$, as shown in FIG. 2. The counters $C_1$ and $C_2$ make up a decimal counter, which frequency divides the local oscillation frequency FML of the FM receiving unit, fed to an input terminal Ta, down to 1/10 and applies the frequency-divided output to a NAND gate $G_1$. On the other hand, the local oscillation frequency AML of an AM receiving unit, fed to an input terminal Tb, is supplied as it is (that is undivided) to the NAND gate $G_1$. Reference characters $Tr_1$ and $Tr_2$ designate transistors which are supplied with the AM and the frequency-divided FM local oscillation frequency to perform switching of them for application to the NAND gate $G_1$.

The operation of the present receiver will hereinafter be described with reference to both FIGS. 1 and 2. At first, the listener sets via the digital setter 6 the frequency of the broadcasting station which he desires to receive. On the other hand, one portion of the output frequency LOF (AML, FML) of a local oscillator of the receiver is sampled by the gate circuit $G_1$ which is opened by a gate signal $Sg_1$ for a very short time, and frequency divided by the counters 1 to 3 ($C_3$ to $C_8$). Their frequency dividing ratios are selected in the following manner: As is well-known, in Japan, the local oscillation frequency is $[(520\sim1600)+455]$ KHz for AM broadcasting, and $[(76\sim90)-10.7]$ MHz for FM broadcasting. Accordingly, where the NAND gate $G_1$ is opened by the gate signal $Sg_1$ for 1 ms., if the local oscillation frequency of AM broadcasting is sampled as it is, and if the local oscillation frequency of FM broadcasting is sampled after being frequency divided by the counters $C_1$ and $C_2$ to 1/10, the NAND gate $G_1$ derives therefrom, at each sampling, $(520\sim1600)+455$ pulses during AM reception and $(7600\sim9000)-1070$ pulses during FM reception. Since the decimal counter $C_3$ frequency divides the output pulses to 1/10, one output pulse derived therefrom represents 10 KHz in the case of AM reception and 100 KHz in the case of FM reception. The output from the counter $C_3$ thus agrees with 10 KHz and 100 KHz which are the units of AM and FM broadcasting frequencies in Japan.

The output from the counter $C_5$ is fed back to the counter $C_4$ through the gate circuit (NAND gate) $G_2$. When the gate circuit $G_2$ is opened by a signal $Sg_3$, no feedback takes place and the counters $C_4$ and $C_5$ become two ordinary stages of flip-flops serving as a quaternary counter. When the gate circuit $G_2$ is closed by the signal $Sg_3$, the feedback loop is established and the counters $C_4$ and $C_5$ form a ternary counter. In the present receiver, during AM reception, the gate circuit $G_2$ is closed to provide the ternary counter and, during FM reception, the gate circuit $G_2$ is opened to provide the quaternary counter. Accordingly, each of these counters derives therefrom its output pulse every 30 KHz during AM reception and every 400 KHz during FM reception.

The presettable counter 3($C_6$ to $C_8$) counts the output pulses from the counter $C_5$ to indicate the receiving frequency. In this case, simply counting the output pulses from the counter $C_5$ is uneconomical because it effects counting and indication of output pulses in unnecessary frequency bands before the broadcasting frequency band is reached. In other words, since only the broadcasting frequency band is required to be indicated, the output pulses from the counter $C_5$ need not be counted until the broadcasting frequency band is reached. To this end, the counters $C_6$ to $C_8$ are each preset with a predetermined complement, by means of a complement setter PI, so that the count value starts with "00 . . . 01" when the broadcasting frequency band is reached. The complement mentioned above is selected in the following manner: The input pulses to the presettable counter 3 at each search are 33rd to 69th pulses during AM reception, and 163rd to 199th pulses during FM reception. Namely, 36 pulses are applied to the presettable counter 3 at each search both in AM and FM reception. For providing a count value "1" only after counting 32 or 162 input pulses, it is sufficient to preset a complement on 32 or 162 in the counter 3. Where the counter 3 is a 9-bit counter, if the BCD value of 32 or 162 is subtracted from "100000000", the difference is "011100000" or "001011110". Whether AM or FM broadcasting is used, the broadcasting frequency range corresponds to 36 pulses in terms of the output pulses from the counter $C_5$, and since its BCD value is 6-bit, there is no need of providing a counter in which the abovesaid difference can be set as it is. The counter may be a 6-bit counter in which are preset six lower-order digits of the abovesaid difference, i.e. "100000" or "011110". Where "100000" or "011110" has thus been preset by the complement setter PI in the 6-bit counters $C_6$ to $C_8$ during AM or FM reception, counting by the counters $C_6$ to $C_8$ starts with the initial state "000001" immediately after the broadcasting frequency is reached, and changes its value to "000010", "000011", "000100", ... every 30 KHz in the case of AM reception and every 400 KHz in the case of FM reception, thus providing an output which counts up to "000100" corresponding to the upper limit of the broadcasting frequency band.

A comparator $CP_2$ is supplied with four high-order bits F, E, D and C of the outputs from the counters $C_6$ to $C_8$, and a comparator $CP_1$ is supplied with two lower-order bits B and A from the counter $C_6$. Since the unit of the broadcasting frequency is 10 KHz in AM broadcasting and 100 KHz in FM broadcasting, three or four frequency units (that is, broadcasting stations) are included in the output pulses from the counters $C_6$ to $C_8$ at intervals of 30 KHz in AM broadcasting and 400 KHz in FM broadcasting. In order to distinguish them, two further lower-order bits $A_2$ and $A_1$ are supplied to the comparator $CP_1$ from the counters $C_5$ and $C_4$. As a result of this, the signals of the receiving frequency applied to the comparators $CP_1$ and $CP_2$ become such as shown in the following Tables 1 or 2, which are also the BCD values of desired broadcating frequencies set by the digital setter 6.

Table 1

| | | | | (AM in Japan) | | | | | |
|---|---|---|---|---|---|---|---|---|---|
| F KHz | 1 ($A_1$) | 2 ($A_2$) | 3 (A) | 4 (B) | 5 (C) | 6 (D) | 7 (E) | 8 (F) | 9 (AM/FM) |
| 520 | 1 | 1 | 0 | 0 | 0 | 0 | 0 | 0 | 1 |
| 30 | 0 | 0 | | | | | | | |
| 40 | 1 | 0 | 1 | 0 | 0 | 0 | 0 | 0 | 1 |
| 50 | 1 | 1 | | | | | | | |
| 60 | 0 | 0 | | | | | | | |
| 70 | 1 | 0 | 0 | 1 | 0 | 0 | 0 | 0 | 1 |
| 80 | 1 | 1 | | | | | | | |
| 90 | 0 | 0 | | | | | | | |
| 600 | 1 | 0 | 1 | 1 | 0 | 0 | 0 | 0 | 1 |
| 10 | 1 | 1 | | | | | | | |
| 20 | 0 | 0 | | | | | | | |
| 1500 | 1 | 0 | 1 | 0 | 0 | 0 | 1 | 1 | 1 |
| 10 | 1 | 1 | | | | | | | |
| 20 | 0 | 0 | | | | | | | |
| 30 | 1 | 0 | 0 | 1 | 0 | 0 | 1 | 1 | 1 |
| 40 | 1 | 1 | | | | | | | |
| 50 | 0 | 0 | | | | | | | |
| 60 | 1 | 0 | 1 | 1 | 0 | 0 | 1 | 1 | 1 |
| 70 | 1 | 1 | | | | | | | |

Table 1-continued

| | | | | (AM in Japan) | | | | | |
|---|---|---|---|---|---|---|---|---|---|
| F KHz | 1 ($A_1$) | 2 ($A_2$) | 3 (A) | 4 (B) | 5 (C) | 6 (D) | 7 (E) | 8 (F) | 9 (AM/FM) |
| 80 | 0 | 0 | | | | | | | |
| 90 | 1 | 0 | 0 | 0 | 1 | 0 | 0 | 1 | 1 |
| 1600 | 1 | 1 | | | | | | | |

Table 2

| | | | | (FM in Japan) | | | | | |
|---|---|---|---|---|---|---|---|---|---|
| f MHz | 1 ($A_1$) | 2 ($A_2$) | 3 (A) | 4 (B) | 5 (C) | 6 (D) | 7 (E) | 8 (F) | 9 (AM/FM) |
| 75.9 | 0 | 0 | | | | | | | 0 |
| 76.0 | 1 | 0 | 1 | 0 | 0 | 0 | 0 | 0 | 0 |
| 76.1 | 1 | 1 | | | | | | | 0 |
| 76.2 | 1 | 1 | | | | | | | 0 |
| 76.3 | 0 | 0 | | | | | | | 0 |
| 76.4 | 1 | 0 | 0 | 1 | 0 | 0 | 0 | 0 | 0 |
| 76.5 | 0 | 1 | | | | | | | 0 |
| 76.6 | 1 | 1 | | | | | | | 0 |
| 76.7 | 0 | 0 | | | | | | | 0 |
| 76.8 | 1 | 0 | 1 | 1 | 0 | 0 | 0 | 0 | 0 |
| 76.9 | 0 | 1 | | | | | | | 0 |
| 89.0 | 1 | 1 | | | | | | | 0 |
| 9.1 | 0 | 0 | | | | | | | 0 |
| 9.2 | 1 | 0 | 0 | 1 | 0 | 0 | 0 | 1 | 0 |
| 9.3 | 0 | 1 | | | | | | | 0 |
| 9.4 | 1 | 1 | | | | | | | 0 |
| 9.5 | 0 | 0 | | | | | | | 0 |
| 9.6 | 1 | 0 | 1 | 1 | 0 | 0 | 0 | 1 | 0 |
| 9.7 | 0 | 1 | | | | | | | 0 |
| 9.8 | 1 | 1 | | | | | | | 0 |
| 9.9 | 0 | 0 | | | | | | | 0 |
| 90.0 | 1 | 0 | 0 | 0 | 1 | 0 | 0 | 1 | 0 |

In the above tables, first to eighth digits are arranged in the order of higher-order digit, and correspond to $A_1$, $A_2$ and A to F in FIG. 2, respectively. The ninth digit is a bit for AM/FM identification which is employed in the digital setting, and indicates AM with "1" and FM with "0".

The operations of the comparators $CP_1$ and $CP_2$ are as follows: When the set frequency Fs provided by the digital setter 6 is lower than the receiving frequency Fa, the comparator $CP_2$ derives a high-level ("H") output at its terminal ta and low-level ("L") outputs at terminals tc and tb. The high-level output is applied to an X-conductor through the output diode $D_5$ connected to the terminal ta to cause the voltage memory device 9 to produce an output in a direction to lower the local oscillation frequency. The voltage memory device 9 is theoretically an integration circuit, which integrates a positive input voltage to produce a gradually increasing output voltage and integrates a negative input voltage to produce a gradually decreasing output voltage, and holds the output voltage for a long time when the input voltage is cut off. The output voltage of the level "L" at the terminal tc of the comparator $CP_2$ conducts the diodes $D_{9L}$ and $D_{10}$ to clamp the output from the comparator $CP_1$ at the level "L". When the local oscillation frequency is dropped by the signal from the X-conductor to approach a set value, the output at the terminal ta of the comparator $CP_2$ drops to the level "L", but instead the output at the terminal tc rises to the level "H", putting the diodes $D_9$ and $D_{10}$ in their nonconducting state. As a result of this, the output from the comparator $CP_1$ becomes effective, and if the local oscillation frequency is still high, the comparator $CP_1$ derives at its terminal ta an output of the level "H", which is applied to the X-conductor through the resistor $R_2$ and the diode $D_6$ to produce a signal for dropping the local oscillation frequency, as is the case with the output at the terminal ta of the comparator $CP_2$. When the local oscillation frequency has thus been further turned down to reach the set value, the output at the terminal ta of the comparator $CP_1$ is returned to the level "L", thus completing the turning operation.

Where the set frequency is higher than the local oscillation frequency, the comparator $CP_2$ provides an output of the level "H" at the terminal tb and outputs of the level "L" at the terminals ta and tc. As a result of this, the output of the level "H" is applied to a Y-conductor through the resistor $R_4$ and the diode $D_8$, causing the voltage memory device 9 to output an instruction for gradually increasing the local oscillation frequency. Also, in this case, the output from the comparator $CP_1$ is locked at the level "L" by the output of the level "L" at the terminal tc of comparator $CP_2$, and when the local oscillation frequency is raised to approach the set frequency, the output from the oscillation $CP_1$ is released to be effective, the tuning operation being completed at the moment when the local oscillation frequency has precisely agreed with the set frequency.

The compared output is thus switched from the comparator $CP_2$ to $CP_1$ during the tuning operation for the following reasons. Since the comparator $CP_2$ compares the high-order bits, the difference in the comparison indicates a large deviation of the local oscillation frequency from the set frequency and, in this case, the local oscillation frequency may be changed rapidly. This is achieved by the illustrated circuit in the following way: When the output level at the terminal tc drops to "L", the diode $D_{11}$ conducts to put the diode $D_{12}$ in the nonconducting state. As a result of this, a signal $Sg_5$ is made invalid and the transistor $Tr_4$ is supplied with only a signal $Sg_4$ which holds the transistor $Tr_4$ in its on state while the NAND gate $G_1$ is opened for sampling and resetting the counters $C_4$ to $C_8$, that is, in the period in which the contents of the counters are changed. Upon conduction of the transistor $Tr_4$, the diodes $D_1$ and $D_2$ conduct and the high-level outputs of the X- and Y-conductors are grounded, so that the control of the local oscillation frequency is interrupted, but since the duty of the signal $Sg_4$ is 80%, this interruption of the control is suppressed to 20% which is the minimum irreducible, and the control is performed at a high speed. Conversely, if the output level at the terminal tc of the comparator $CP_2$ is raised to the level "H", the diode $D_{11}$ becomes nonconducting, permitting the signal $Sg_5$ to be applied to the transistor $Tr_4$ through the diode $D_{12}$ of the OR circuit. Since the duty of the signal $Sg_5$ is about 30%, the period of conduction of the diodes $D_1$ and $D_2$ becomes longer, so that the control of the local oscillation frequency is performed at a lower speed. This is effective for preventing an excessive control of the local oscillation frequency.

The diodes $D_3$ and $D_4$, the resistors $R_5$ to $R_7$ and the transistor $Tr_3$ make up a circuit for obtaining a muting signal. When either one of the X- and Y-conductors has the output of the level "H", the transistor $Tr_3$ is turned on to provide a muting signal $Sg_6$. This is used for the removal of noises which are emitted from a speaker due to short-circuiting of an audio amplifier input signal during the tuning operation.

Now, a detailed description will be given of the voltage memory device indicated by 9 in FIG. 1.

Figures 3A, 3B:
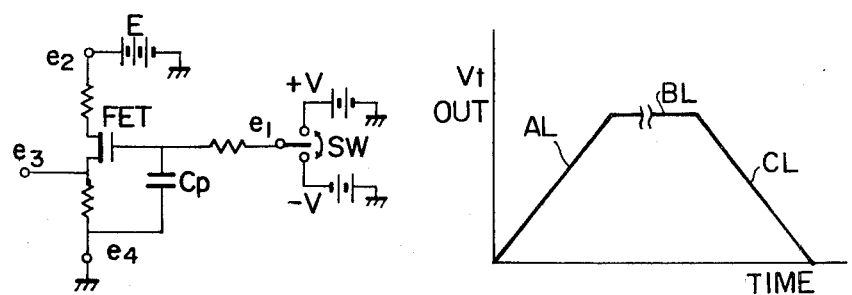
FIG. 3(A) is a circuit diagram explanatory of a voltage memory device.
FIG. 3(B) is a graph showing the variations in the output voltage from the voltage memory device.

The voltage memory device is a recently developed circuit element which has the function of producing a voltage proportional to the time of application of the input voltage, and which has such a construction, for example, as illustrated in FIG. 3A. In FIG. 3A, in the state in which a terminal $e_2$ is connected to a DC power supply E and a terminal $e_4$ is grounded, upon application of a positive DC voltage $+V$ to an input terminal $e_1$ through a single-pole, double-throw center-off switch SW, a capacitor Cp is gradually charged to raise the gate potential of a field effect transistor FET, and the potential at an output terminal $e_3$ connected to the source of the field effect transistor FET rises correspondingly. On the other hand, when a DC voltage $-V$ is applied to the input terminal $e_1$, with the abovesaid single-pole, double-throw center-off switch SW switched to the side of the negative DC power supply, the capacitor Cp is gradually discharged, so that the gate potential of the field effect transistor FET is controlled to drop the potential at the output terminal $e_3$. When the single-pole, double-throw center-off switch SW is held in the center-off state, since the input impedance of the field effect transistor FET is very high, the leak discharge path of the capacitor Cp is completely cut off and the output potential at this moment can be maintained in a stable state for a long time. FIG. 3B shows fluctuations of the output voltage (Vt OUT) appearing at the abovesaid output terminal $e_3$, the line AL indicating the state in which, upon application of the positive input voltage, the output voltage rises in proportion to time, the line BL the state in which the potential at the time of cutting off of the input is stored, and the line CL the state in which, upon application of the negative input voltage, the output voltage drops in proportion to time. For further details of the structure of the voltage memory device and its modifications, refer, for example, to U.S. Pat. No. 3,889,133 entitled "Output-Voltage Variable Device" and U.S. Pat. No. 3,467,870 entitled "Automatic Frequency Sweep Apparatus".

Next, a detailed description will be made of a preferred embodiment of auto tuner employing the voltage memory device.

Figure 4:
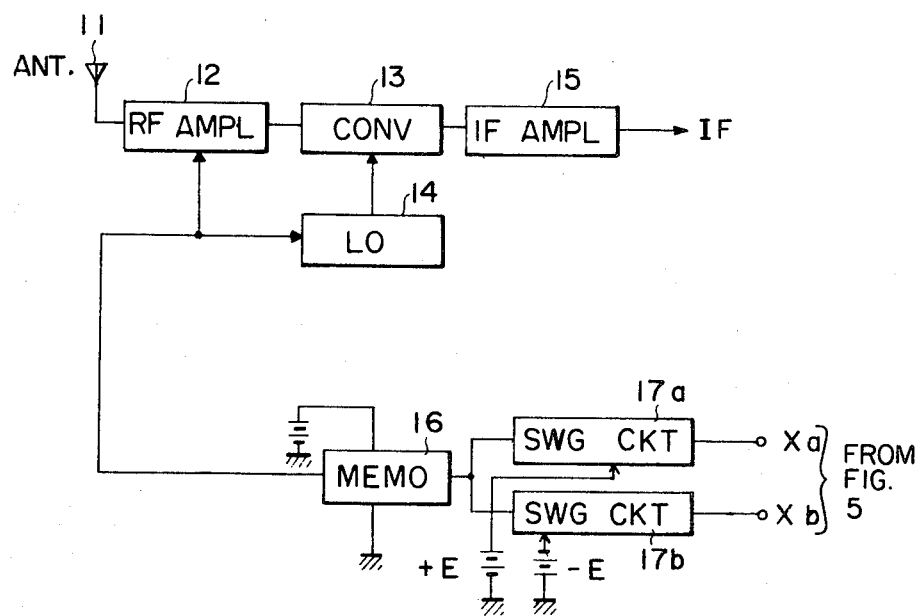
FIG. 4 is a block diagram illustrating the principal part of the receiver.

FIG. 4 shows the principal part of a superheterodyne radio receiver. Reference numeral 11 indicates an antenna; 12 designates a high-frequency amplifier; 13 identifies a frequency converter; 14 denotes a local oscillator; 15 represents an intermediate-frequency amplifier; and 16 shows the voltage memory device. A switching circuit 17a is closed by an upward frequency search instruction signal Xa and, when a positive voltage $+E$ is applied to the circuit 17a, the output from the voltage memory device 16 gradually increases. By a downward frequency search instruction signal Xb, a switching circuit 17b is closed, and upon application of a negative voltage $-E$, the output from the voltage memory device 16 gradually decreases. The output from the voltage memory device 16 is applied as a control voltage to the local oscillator 14 to increase or decrease its oscillation frequency. The above-said output is also applied to the high-frequency amplifier 12 to change the capacitor of its varactor, altering the tuning frequency.

Figure 5:
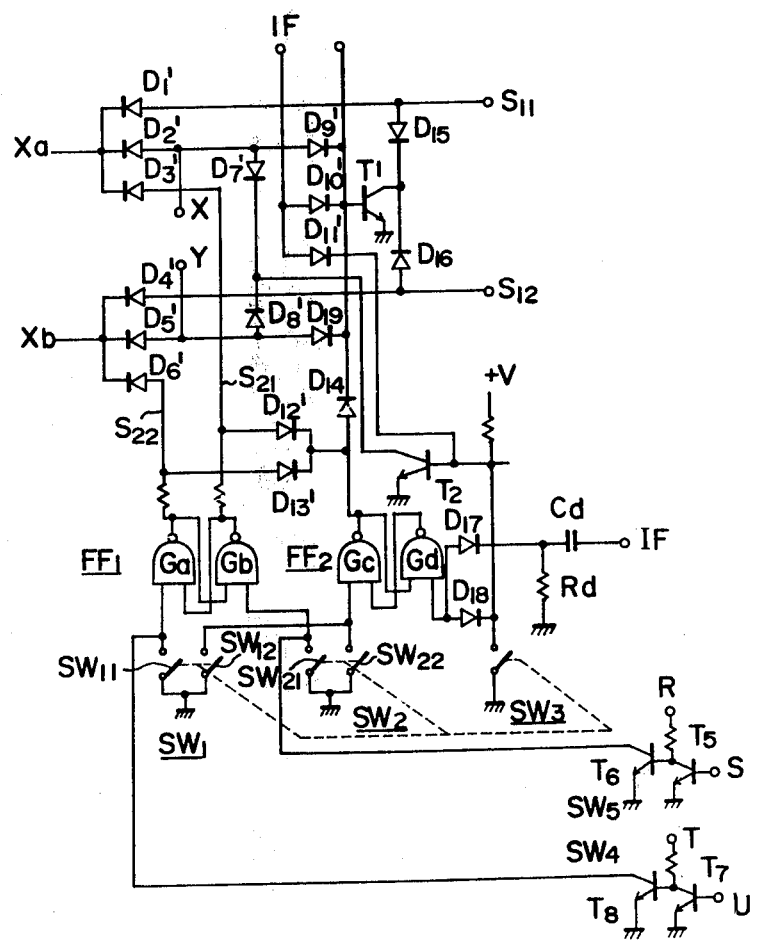
FIGS. 5 and 6 are block diagrams showing another embodiment of this invention.

FIG. 5 illustrates circuit connections for generating the aforesaid instruction signals Xa and Xb. Reference characters $D_1'$ to $D_3'$ and $D_4'$ and $D_6'$ indicate diode groups forming OR circuits, to which are respectively applied frequency correcting instruction signals $S_{11}$ to $S_{12}$ from an AFC circuit (not shown), search instruction signals X and Y from a digital setting circuit (not shown) and search instruction signals $S_{21}$ and $S_{22}$ from a flip-flop circuit $FF_1$. The AFC circuit is supplied with a deviation signal indicative of a deviation from the tuning point from a frequency discriminator of the AM or FM receiver to generate the frequency correcting instruction signal $S_{11}$ or $S_{12}$. The digital setting circuit compares the count values of a digital signal corresponding to a preset desired broadcasting frequency and the local oscillation frequency with the counted output (a digital output) corresponding to a detected receiving frequency to provide the search instruction signal X or Y according to the difference detected by the comparison, as described previously with regard to FIGS. 1 and 2. The circuit portion including the flip-flop $FF_1$ is composed of two NAND gates Ga and Gb. The NAND gate Ga has one of its input terminals connected to a contact $SW_{11}$ of a switch $SW_1$ and a switching circuit $SW_4$, and the other input terminal connected to the output terminal of the NAND gate Gb. The NAND gate Gb has one of its input terminals connected to a contact $SW_{21}$ of a switch $SW_2$ and a switching circuit $SW_5$, and the other input terminal connected to the output terminal of the NAND gate Ga. Reference character $FF_2$ designates a flip-flop circuit, which is comprised of two NAND gates Gc and Gd. The NAND gate Gc has one of its input terminals connected to contacts $SW_{12}$ and $SW_{22}$ of the switches $SW_1$ and $SW_2$, the other input terminal connected to the output terminal of the NAND gate Gd. The NAND gate Gd has one of its input terminals connected to a switch $SW_3$ through a diode $D_{18}$, and the other input terminal connected to the output terminal of the NAND gate Gc. These switches $SW_1$ to $SW_3$ are, for instance, push-button type, and have the function of temporarily grounding the respective input terminals. The switching circuits $SW_4$ and $SW_5$ comprise transistors $T_7$ and $T_8$, and $T_5$ and $T_6$, respectively, and have the function of a limit switch. Many diodes $D_7'$, $D_8'$, $D_9'$, . . . are provided for muting and have the function of grounding two of the abovesaid three kinds of instruction signals to make them ineffective in cooperation with the transistors $T_1$ and $T_2$ and the flip-flop circuit $FF_2$ when the remaining instruction signal is outputted.

Figure 6:
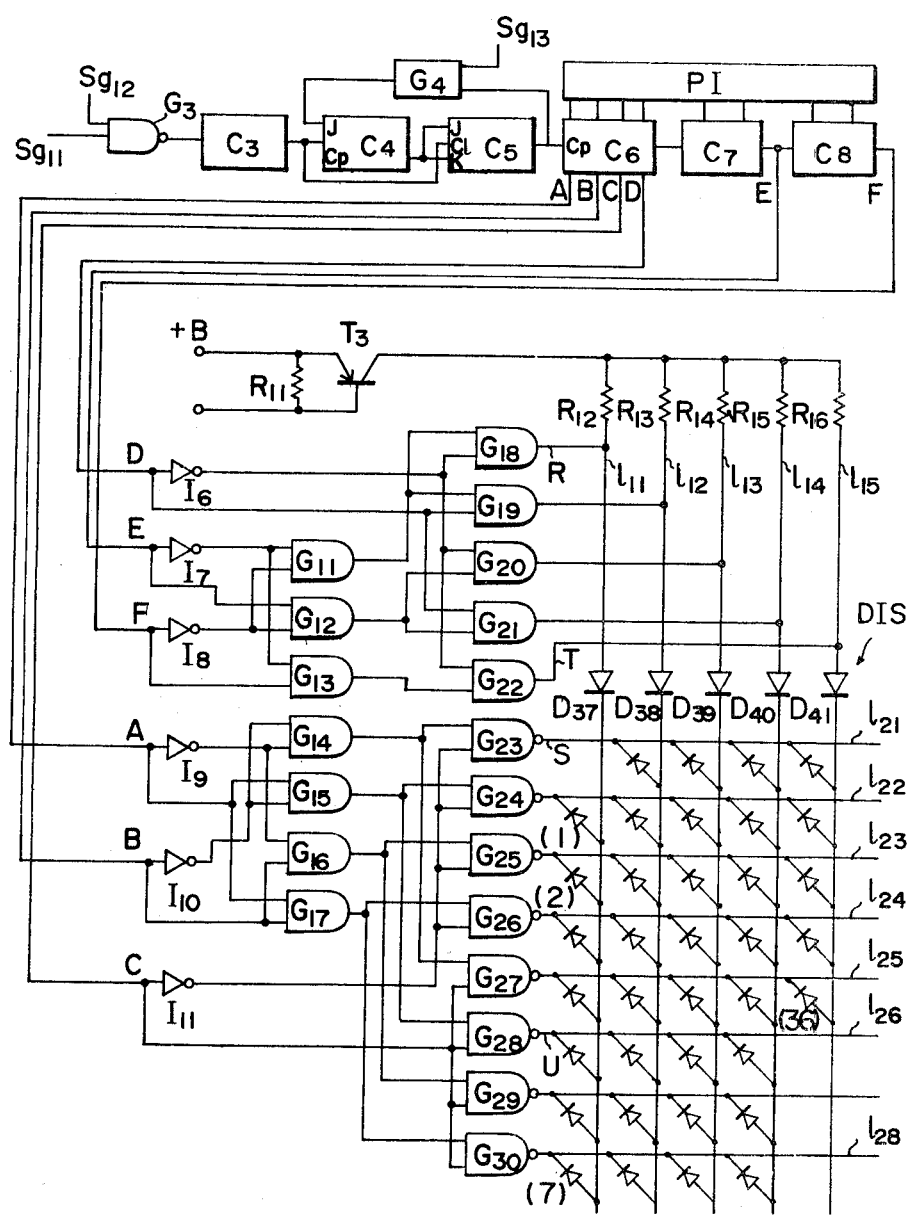

FIG. 6 illustrates a circuit for producing search direction reversal instruction signals R, S, T and U for controlling the switching circuits $SW_4$ and $SW_5$ of FIG. 5. The outline of this circuit is as follows: Reference character $G_3$ indicates a NAND gate for sampling the local oscillation frequency, and $C_3$ to $C_6$ designate frequency-dividing counters such as described previously in connection with FIGS. 1 and 2. In Japan, the local oscillation frequency is $[(520 \sim 1600)+455]$KHz in the case of AM broadcasting and $[(77 \sim 90)-10.7]$KHz in the case of FM broadcasting. The former is sampled as it is (without frequency division), and the latter is sampled after being frequency divided to 1/10. In FIG. 6, a signal $Sg_{11}$ is sampled by the NAND gate $G_3$ which is opened by a gate signal $Sg_{12}$ for 1/1000 sec. The sampling signal is frequency divided by counters $C_4$ and $C_5$ to ⅓ in AM reception and ¼ in FM reception, which counters $C_4$ and $C_5$ are switched selectively to the ternary and the quaternary operation by a gate $G_4$ which is controlled by a signal $Sg_{13}$ to be opened during AM reception and closed during FM reception. Further, a complement which provides a count "1" at the lower limit of the broadcasting frequency band, is preset by the complement setter PI in the presettable counters $C_6$ to $C_8$. When supplied with the output pulse from the counter $C_5$, the counters $C_6$ to $C_8$ derive therefrom outputs which represent decimal numbers 1 to 36 and indicate in the form of 6-bit BCD code the overall broadcasting frequency band every 30 KHz in AM reception and every 400 KHz in FM reception. The three higher-order bits F, E and D of the 6-bit BCD code from "000001" to "100100" are applied to a decoder composed of inverters $I_6$ and $I_8$ and AND gates $G_{11}$ to $G_{13}$ and $G_{18}$ to $G_{22}$ to select one of vertical conductors $l_{11}$ to $l_{15}$ of a matrix, and the three lower-order bits C, B and A are applied to a decoder comprised of inverters $I_9$ to $I_{11}$, AND gates $G_{14}$ to $G_{17}$ and NAND gates $G_{23}$ to $G_{30}$ to select one of horizontal conductors $l_{21}$ to $l_{28}$, by which one of light emitting diodes (1) to (36) connected at the intersections of the vertical and horizontal conductors is lighted to indicate the receiving frequency.

In the illustrated circuit, reference character $T_3$ indicates a switching transistor for inhibiting the provision of the indication when the counter content changes, for example, during sampling; $R_{11}$ to $R_{16}$ designate resistors; and $D_{37}$ to $D_{41}$ identify protective diodes. The lighting of the light emitting diode takes place via a route from the power supply +B to a selected one of the horizontal conductors $l_{21}$ to $l_{28}$ through the transistor $T_3$, a selected one of the resistors $R_{12}$ to $R_{16}$, a selected one of the vertical conductors $l_{11}$ to $l_{15}$, a selected one of the diodes $D_{37}$ to $D_{41}$ and the selected one of the light emitting diodes (1) to (36) at the intersection of the selected vertical and horizontal conductors. That is, the AND gates $G_{18}$ to $G_{22}$ for the vertical conductor selection each produce a high-level output to make the power supply +B effective to thereby select one of the conductors.

The NAND gates $G_{23}$ to $G_{30}$ each produce a low-level output to ground one end of the selected conductor, and accordingly the light emitting diode, thereby to achieve conductor selection.

The matrix indicator circuit shown in FIG. 6 has 40 intersections and 36 indicating elements, so that four intersections are left. Then, the indicating elements are arranged so that the lowest receiving frequency corresponds to the intersection of the second horizontal conductor $l_{22}$ and the first vertical conductor $l_{11}$ and that the highest receiving frequency corresponds to the intersection of the fifth horizontal conductor $l_{25}$ and the fifth vertical conductor $l_{15}$. With such an arrangement, the intersection of the first vertical and horizontal conductors $l_{11}$ and $l_{21}$ and the intersection of the last vertical conductor $l_{15}$ and the sixth horizontal conductor $l_{26}$ corresponds to frequency regions immediately outside of the lower and upper limits of the receiving frequency range, respectively. The selection of such intersections implies that the frequency search is outside of the receiving frequency range. Accordingly, the aforesaid switching circuits $SW_5$ and $SW_4$ (FIG. 5), which are opened and closed by signals R and S, T and U indicative of the above, serve as electronic limit switches.

Next, the operation of the abovesaid auto tuner will be described. At first, when the downward search control switch $SW_1$ (FIG. 5) is operated to close its contacts $SW_{11}$ and $SW_{12}$, the NAND gate Ga is grounded at one input terminal to produce a high-level (H) output. This output is applied to the diode $D_6'$ to provide the downward search instruction signal Xb to cause a gradual decrease in the oscillation frequency of the local oscillator 14 (FIG. 4) through the switching circuit 17b and the voltage memory device 16 and in the tuning frequency of the tuning circuit of the high-frequency amplifier 12. With closing of the contact $SW_{12}$ (FIG. 5), the NAND gate Gc is grounded at one input terminal to provide a high-level output, which cuts off the diodes $D_{12}'$ and $D_{13}'$ and is applied through a diode $D_{14}$ to a transistor $T_1$ to turn it on. As a result of this, diodes $D_{15}$ and $D_{16}$ become conducting so as to ground the frequency correcting instruction signals $S_{11}$ and $S_{12}$ from the AFC circuit. Since the switch $SW_3$ which is closed during digital setting is opened at this time, a transistor $T_2$ is in its on state, with the result that search instruction signals X and Y from the digital setter are grounded through the diodes $D_7'$ and $D_8'$ and the transistor $T_2$.

When a receiving frequency was tuned to the broadcast frequency by the local oscillation frequency being gradually decreased during the downward frequency search, the intermediate-frequency amplifier 15 (FIG. 4) produces an output IF, and this intermediate-frequency signal IF drops one input of the NAND gate Gd (FIG. 5) to the low level and raises its output to the level "H" through a differentiation circuit composed of a capacitor Cd and a resistor Rd. As a result of this, the inputs to the NAND gate Gc both rise to the level "H" (At this time, the contact $SW_{12}$ is already turned off.), providing an output of the level "L". Consequently, diodes $D_{12}'$ and $D_{13}'$ become conductive to clamp the output from the flip-flop $FF_1$ at the level "L", stopping the frequency search. When the received broadcasting frequency is not that of a desired broadcasting station, the downward search control switch $SW_1$ is repressed. In the case where the frequency search is desired to be in the upward direction, the upward search control switch $SW_2$ is pressed. At this time, the NAND gate Gb produces the output of the level "H", which is applied to the diode $D_3'$ to provide the upward search instruction signal Xa, causing a gradual increase in the local oscillation frequency. The flip-flop $FF_2$ is put in the same output state as in the case of the downward frequency search, and its output is similarly clamped to stop the frequency search upon tuning.

During the downward or upward frequency search, if the search gets over the upper limit of the broadcasting frequency band without detecting any broadcasting station, the switching circuit $SW_4$ is closed, and if the search gets out of the lower limit of the broadcasting frequency band, the switching circuit $SW_5$ is closed. This is accomplished by the following operations: At the moment when the frequency search passes the upper or lower limit of the broadcasting frequency band, the search direction reversal instruction signals S and U drop to the level "L" to turn off transistors $T_5$ and $T_7$, and the search direction reversal instruction signals R and T rise to the level "H" to turn on transistors $T_6$ and $T_8$. Namely, closing of the switching circuit $SW_4$ produces the same effect as closing of the contact $SW_{11}$ of the downward search control switch $SW_1$ and the flip-flop $FF_1$ inverts its output to derive an output of the level "H" from the NAND gate Ga, starting the downward search. And closing of the switch SWS has the same effect as in the case of closing the contact $SW_{21}$ of the upward search control switch $SW_2$, with the result that the output from the flip-flop $FF_1$ is inverted to derive an output of the level "H" from the NAND gate Gb, thus starting the upward search. In this case, the flip-flop $FF_2$ is not supplied with any inputs, and remains unchanged. Since resetting as by the intermediate frequency signal IF does not take place, the abovesaid flip-flop may be retained as it is.

As is evident from the above, in accordance with the auto tuner described above, the nearest broadcasting station in the downward or upward direction can be automatically tuned by temporarily closing the downward search control switch $SW_1$ or the upward search control switch $SW_2$, and where the tuned broadcasting station is not a desired one, the next broadcasting station can be tuned by temporarily closing the switch $SW_1$ or $SW_2$ again. Of course, if the switch $SW_1$ or $SW_2$ is held in its closed state, the frequency search is not interrupted and continuous tuning can be achieved until the desired broadcasting station is tuned. Where the desired broadcasting station cannot be tuned by the upward or downward search, the electronic limit switch circuit is closed, by which the direction of frequency search can be automatically reversed. Since the control signal of the limit switch circuit can be derived from the receiving frequency indicator unit, there is no need of providing a complicated detector circuit for the abovesaid control signal.

Next, a detailed description will be given of a preferred embodiment of the muting circuit referred to previously in connection with FIG. 2.

Figure 7:
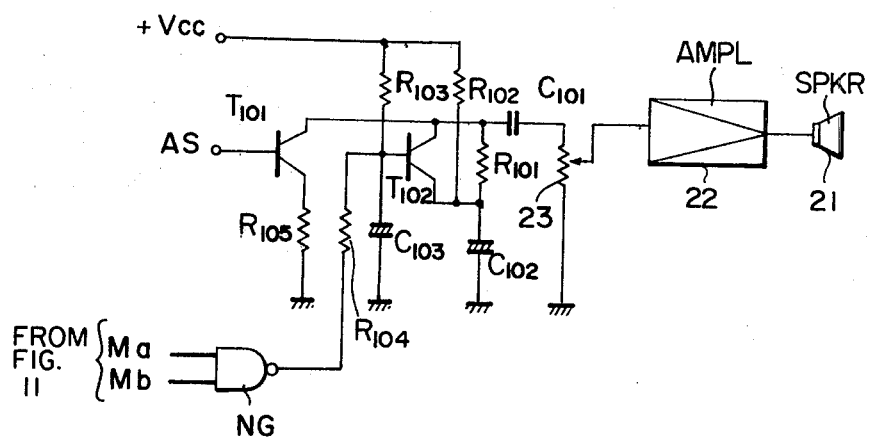
FIG. 7 is a circuit diagram illustrating an example of a muting circuit.

FIG. 7 illustrates an embodiment of the muting circuit. Reference numeral 21 indicates a speaker of a radio receiver; 22 designates an audio amplifier; 23 identifies a variable resistor for volume control; $C_{101}$ denotes a coupling capacitor; $R_{101}$ represent a load resistor; $C_{102}$ shows a smoothing capacitor; $T_{101}$ refers to an amplifying transistor; $R_{102}$ thru $R_{105}$ indicate resistors; and $V_{cc}$ designates a power source voltage. These elements constitute a known low-frequency amplifier circuit, which amplifies an audio signal AS to drive the speaker 21. The muting circuit comprises the transistor $T_{102}$ connected in parallel with the load resistor $R_{101}$; and the resistor $R_{103}$, the capacitor $C_{103}$, the resistor $R_{104}$ and the NAND gate NG form a control circuit for the muting circuit. The NAND gate NG is supplied with signals Ma and Mb indicative of a digital search for tuning (described later). When supplied with either one of the signals Ma and Mb, the NAND gate NG produces an output of the level "H" to turn on the transistor $T_{102}$, short-circuiting the resistor $R_{101}$. As a result of this, no signal voltage is applied to the audio amplifier 22 and, at the same time, noises are also cut off, thus achieving muting. The signals Ma and Mb are derived from circuit shown in FIG. 11, which operates in cooperation with circuits of FIGS. 9 and 10.

Figure 9:
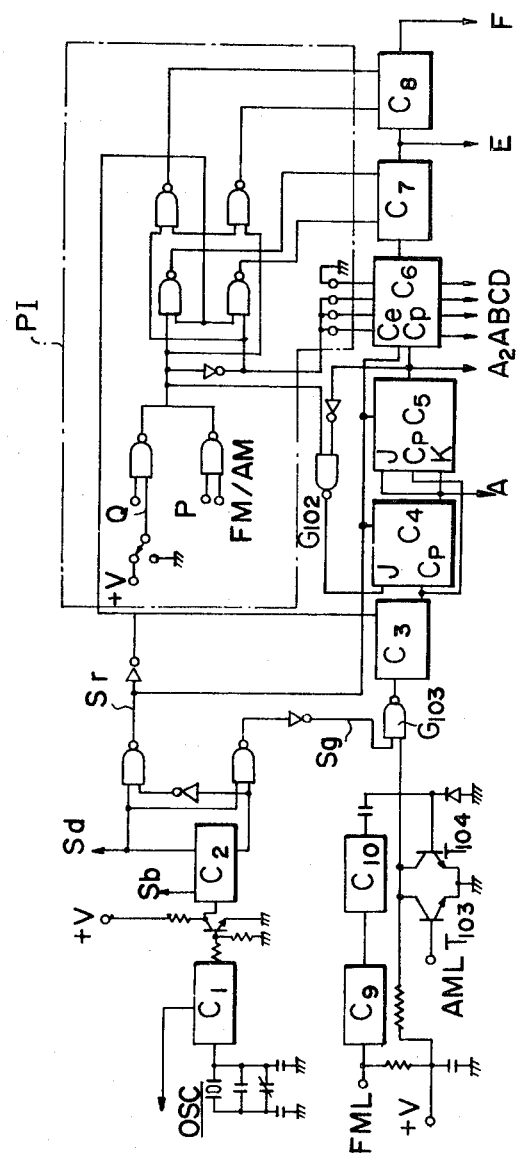
FIG. 9 is a block diagram showing mainly a frequency divider circuit portion for the detection of a receiving frequency.
Figure 10:
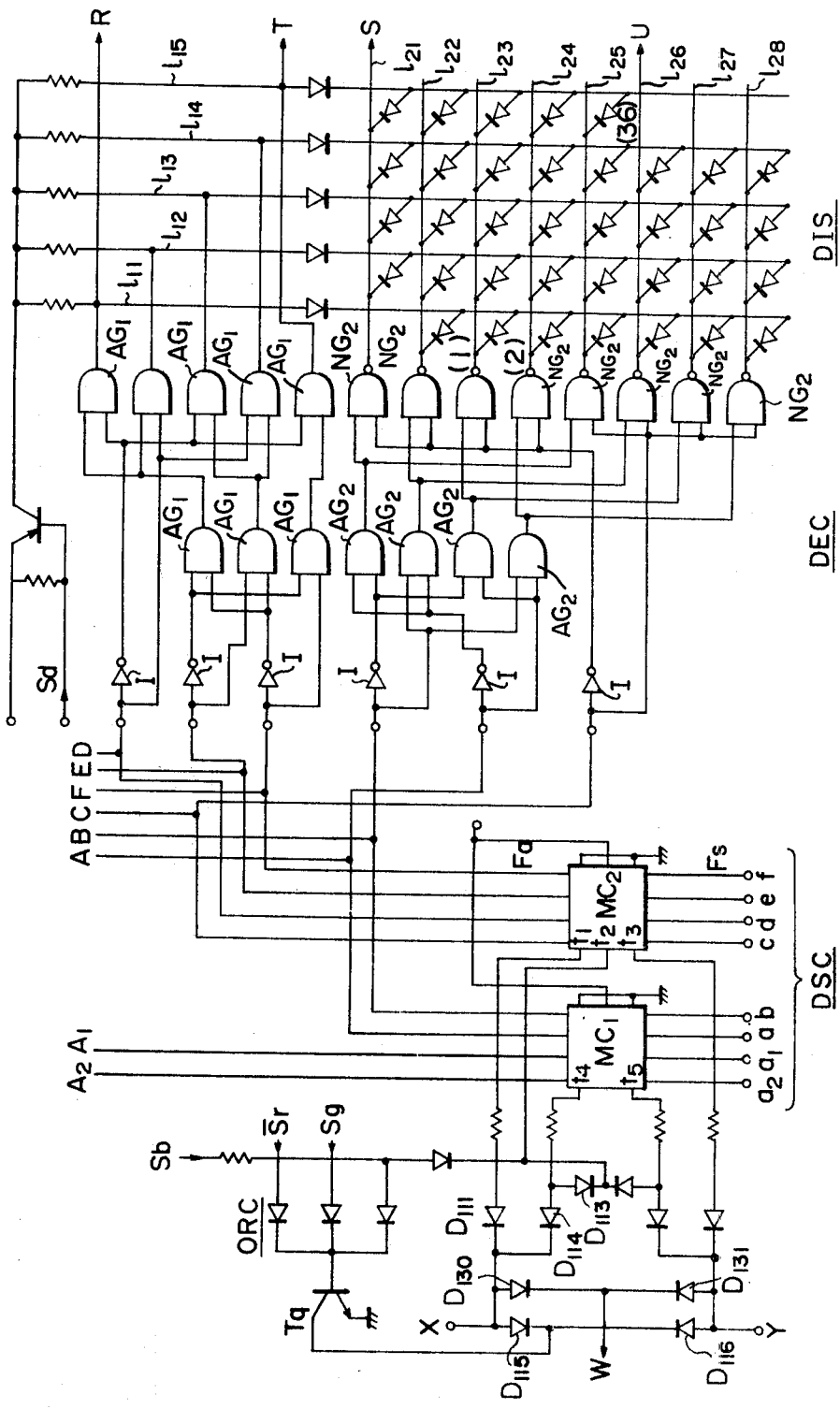
FIG. 10 is a block diagram illustrating mainly a display and a digital tuning portion.
Figure 11:
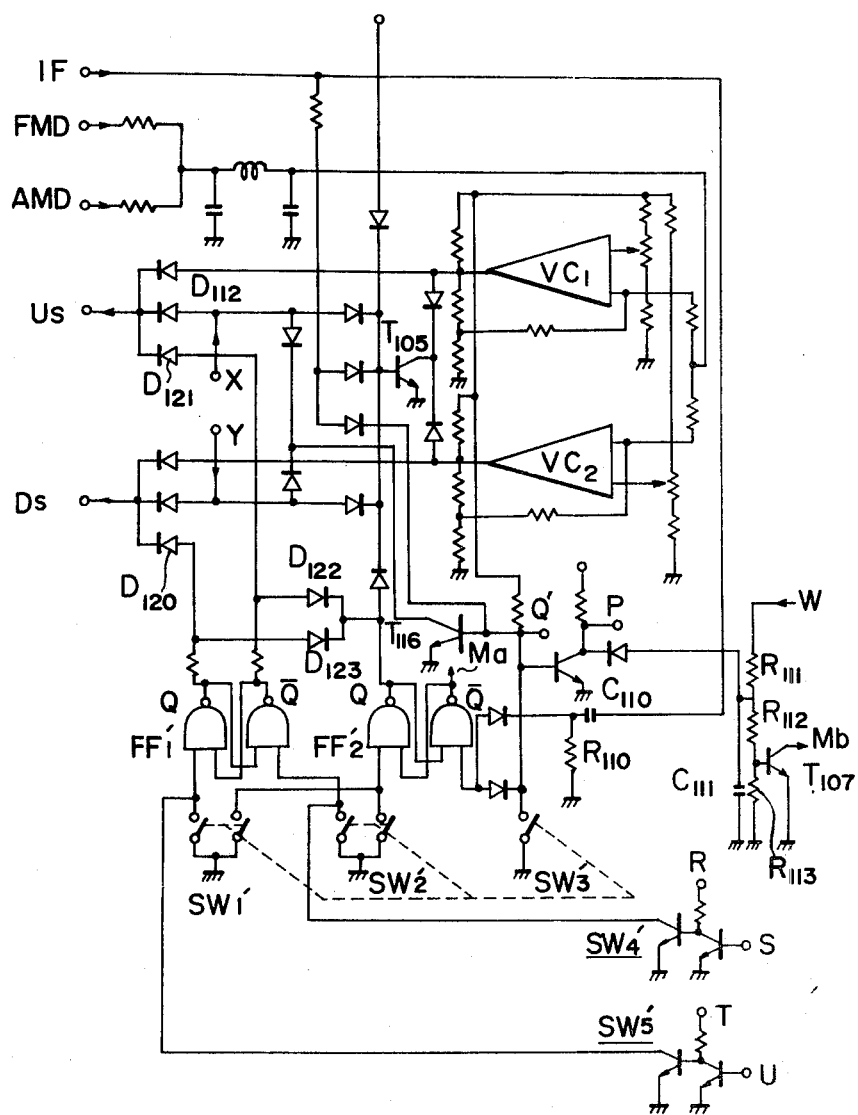
FIG. 11 is a block diagram showing mainly a search tuning and a muting signal generating portion.

FIG. 9 shows a circuit for sampling and frequency dividing the output frequency of the local oscillator of the receiver for the detection of the receiving frequency, and a circuit for generating various control pulses. FIG. 10 shows a circuit for indicating the receiving frequency and achieving tuning by digital setting. FIG. 11 shows a circuit for generating a voltage memory device control instruction.

In FIG. 9, reference character OSC indicates a crystal oscillator. The counters $C_1$ and $C_2$ frequency divide its output to provide a gate signal Sg and a reset signal Sr in cooperation with an inverter and a NAND gate. The gate signal Sg is applied to a NAND gate $G_{103}$. In the case of AM reception, the output frequency (local oscillation frequency) AML of the local oscillator is directly applied to the NAND gate $G_{103}$. In the case of FM reception, the output frequency FML of the local oscillator is frequency divided to 1/10 by counters $C_9$ and $C_{10}$, and then applied to the NAND gate $G_{103}$ through a transistor $T_{104}$. Since the NAND gate $G_{103}$ is opened by the gate signal Sg for 1/1000 sec., sampling of the local oscillation frequency takes place in this period. The local oscillation frequency thus picked up is frequency divided by the counter $C_3$ to 1/10, and is further frequency divided to $\frac{1}{3}$ or $\frac{1}{4}$ by the counters $C_4$ and $C_5$ which are caused, by opening and closing of a NAND gate $G_{102}$, to perform the function of the ternary counter during AM reception and the quaternary counter during FM reception. In Japan, since the local oscillation frequency is [(520~1600)+455]KHz in the case of AM broadcasting and [(76~90)−10.7]MHz in the case of FM broadcasting, each pulse of such frequency-divided and sampled output from the counter $C_5$ corresponds to 30 KHz in AM reception and 400 KHz in FM reception. Such pulses are supplied to the presettable counter $C_6$ to $C_8$ in which a complement is so preset by the complement setter PI as to provide a count "1" when counting 33 pulses corresponding to 975 KHz in AM reception and 166 pulses corresponding to 66.7 MHz in FM reception. Accordingly, in the broadcasting frequency band, the presettable counters provide a count value "1" at a minimum and a count valve "36" at a maximum. The BCD codes A to F of such a count value are derived from the respective stages of the counters. Further, since the unit of the broadcasting frequency is 10 KHz in AM broadcasting, and 100 KHz in FM broadcasting, there may be between the respective output states of the presettable counters $C_6$ to $C_8$ three broadcasting frequencies in AM reception and four broadcasting frequencies in FM reception at a maximum. To distinguish them, two lower-order bits, that is, signals $A_1$ and $A_2$, are derived from the counters $C_4$ and $C_5$ to provide a BCD output of eight bits as a whole.

In FIG. 10, the three high-order bits DEF of the 6-bit signals A to F are used for the selection of the vertical conductors $l_{11}$ to $l_{15}$ of a matrix display DIS by a first decoder composed of various inverters I and AND gate, as shown $AG_1$. The low-order bits ABC are used for the selection of the horizontal conductors $l_{21}$ to $l_{28}$ by a second decoder composed of various inverters I, AND gates $AG_2$ and NAND gates $NG_2$. The light emitting diodes (1) to (36) connected to the intersections of the vertical and horizontal conductors are selectively lighted to indicate a receiving frequency, as described previously.

The signals $A_2$, $A_1$ and A to F of the 8-bit BCD output are divided into a group of the four higher-order bits and a group of the four lower-order bits, which are respectively applied to first and second digital comparators $MC_1$ and $MC_2$ corresponding to digital comparators $CP_1$ and $CP_2$, respectively, of FIG. 2. To the other inputs of the comparators $MC_1$ and $MC_2$, there are supplied from a digital setter circuit (DSC) through BCD signal lines $a_1$, $a_2$ and a to f signals which also designate a desired broadcasting frequency. If the receiving frequency is taken as Fa and if the set frequency is taken as Fs, when Fa<<Fs, the comparator $MC_2$ derives an output of the high level (H) at a terminal $t_1$ and outputs of the low level (L) at terminals $t_2$ and $t_3$. The high-level output is applied to a diode $D_{111}$ to provide a control signal X, which is applied to a diode $D_{112}$ in FIG. 11 to produce an upward search instruction signal Us, instructing the voltage memory device (not shown) to gradually decrease its output. The output voltage of the voltage memory device is applied to a local oscillator of the type changing its oscillation frequency with voltage, so that the output frequency of this local oscillator is raised. When the receiving frequency Fa approaches the set frequency Fs to coincide therewith in the high-order bit, the comparator $MC_2$ (FIG. 10) drops the output at the terminal $t_1$ to the level L and raises the output at the terminal $t_2$ to the level H.

When the output at the terminal $t_2$ is altered from the level L to H the output from the comparator $MC_1$ clamped by a diode $D_{113}$ at the level L is released because the diode $D_{113}$ is made nonconducting and the released output is applied to a diode $D_{114}$ to produce the control signal X to define the local oscillation frequency raising instruction. When the both frequencies Fa and Fs completely coincide with each other in the lower-order bits, the output at a terminal $t_4$ of the comparator $MC_1$ is also turned down to the level L to stop the changing of the local oscillation frequency. Also when Fa>Fs, substantially the same operations as described above are carried out except that the outputs at the terminals $t_3$ and $t_5$ are raised to the level H to produce a control signal Y and a downward search instruction signal Ds.

The output at the terminals $t_1$ and $t_3$ of the comparators $MC_1$ and $MC_2$ are continuously produced as long as Fa≠Fs, but the control signals X and Y are intermitted by diodes $D_{115}$ and $D_{116}$ and a transistor Tq. That is, a signal Sb having a duty of about 30% from the counter $C_2$ (FIG. 9), the gate signal Sg, and an inverted value $\bar{S}r$ of the reset signal Sr are applied to the transistor Tq through a diode OR circuit ORC to turn on the transistor Tq in the sampling and resetting periods in which the value of the receiving frequency Fa varies in the counter.

When the comparator $MC_2$ detects the input coincidence and raises the output at the terminal $t_2$ to the level H, the signal Sb also becomes effective to turn on the transistor Tq. Upon turning on of the transistor Tq, the control signals X and Y are grounded through diodes $D_{115}$ and $D_{116}$ and the transistor Tg to provide a non-signal state. As a result of this, at the output of the comparator $MC_2$, auto tuning is achieved by the control signals X and Y having a duty of about 80% (refer to FIG. 8(1)) at a relatively high speed, and at the output of the comparator $MC_1$, auto tuning is performed by the control signals X and Y having a duty of about 30% at a relatively low speed. The tuning by the comparators $MC_1$ and $MC_2$ is called "tuning by digital selection" in this specification.

FIG. 11 illustrates mainly a tuning circuit which is started by a manual switch. In FIG. 11, reference character $SW_1'$ indicates a downward search control switch; $SW_2'$ designates an upward search control switch; $SW_3'$ identifies a switch which is closed during digital setting; and $FF_1$, and $FF_2$, denote first and second flip-flop circuits. In the tuning circuit, upon closing the downward search control switch $SW_1'$, the output Q from the first flip-flop circuit $FF_1$, rises to the level H and this output passes through a diode $D_{120}$ to produce the downward search instruction signal Ds, causing a decrease in the local oscillation frequency through the voltage memory device (not shown). Upon closing the upward search control switch $SW_2'$, the output $\bar{Q}$ from the flip-flop circuit $FF_1'$ rises to the level H and this output passes through a diode $D_{121}$ to produce the upward search instruction signal Us to increase the local oscillation frequency. When these switches $SW_1'$ and $SW_2'$ are closed, the second flip-flop circuit $FF_2$, raises its output Q to the level H and the system in which tuning is taking place is made effective by many diodes illustrated and the transistors $T_{105}$ and $T_{116}$, with the other tuning systems being ineffective.

When the broadcasting frequency is tuned by increasing or decreasing the local oscillation frequency, the intermediate-frequency amplifier produces the output IF, which is applied to the second flip-flop circuit $FF_2'$ through a differentiation circuit composed of a capacitor $C_{110}$ and a resistor $R_{110}$, triggering the second flip-flop circuit $FF_2'$ to invert it. As a result of this, the outputs Q and $\overline{Q}$ from the second flip-flop circuit $FF_2'$ are at the levels L and H, respectively. The outputs Q and $\overline{Q}$ from the first flip-flop circuit $FF_1'$ are clamped at the level L of the output Q of the second flip-flop circuit $FF_2'$ through diodes $D_{122}$ and $D_{123}$ to cut off the search instruction signals Us and Ud, stopping the tuning operation. Such a tuning operation is called search tuning in this specification.

Switches $SW_4'$ and $SW_5'$ function as limit switches which operate at the upper and lower limits of the receiving frequency bands, respectively, and are closed by decoder outputs R to U of the display DIS to reverse the search direction. Reference characters $VC_1$ and $VC_2$ indicate voltage comparators which form an AFC circuit, and are supplied with the output AMD or FMD from an AM or FM discriminator to generate an upward frequency correcting signal Us and a downward frequency correcting signal Ds according to the deviation of the tuning point. Further, during digital setting, the switch $SW_3'$ is closed to make the other tuning systems ineffective and produce signals P and Q', controlling the complement setter PI.

Based on the facts that during digital tuning, the control signals X and Y appear and that during search tuning, the output from the flip-flop $FF_2'$ is of the level H (the output Q) or L (the output $\overline{Q}$), the muting signal for preventing the generation of audio signals (noises) can be obtained from the above signals. A transistor $T_{107}$ is provided for obtaining the muting signal Mb, and has its base connected through resistors $R_{111}$ and $R_{112}$ to the connection point W of diodes $D_{130}$ and $D_{131}$ (FIG. 10). The other ends of these diodes are supplied with the control signals X and Y and the base of the transistor $T_{107}$ is grounded through a resistor $R_{113}$. A capacitor $C_{111}$ is connected in parallel to the resistors $R_{112}$ and $R_{113}$.

Figure 8:
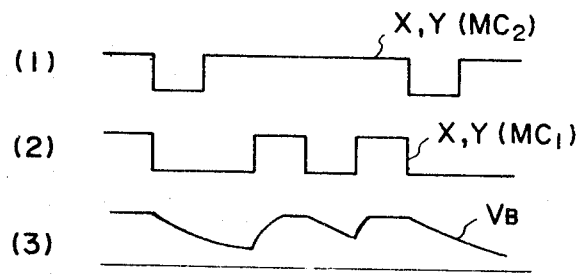
FIG. 8 shows a series of waveform diagrams explanatory of the operation of the muting circuit of FIG. 7.

The operation of the tuning circuit shown in FIG. 11 is as follows: During digital tuning, if the signal X or Y of the level H is produced when Fa≠Fs, the transistor $T_{107}$ is turned on through the diode $D_{130}$ to $D_{131}$ and the resistors $R_{112}$ and $R_{113}$ to provide the muting signal Mb of the level L. Since the control signals X and Y are repetitive pulses intermittent with duties of 30 and 80%, respectively, as described previously, there is a fear that demuting signal is also made intermittent. The capacitor $C_{111}$ is provided to prevent it, and constitutes an integration circuit together with the resistors $R_{111}$ to $R_{113}$, by which the transistor $T_{107}$ is prevented from being intermitted while Fa≠Fs. FIG. 8 is explanatory of the above, (1) showing the signals X and Y when the comparator $MC_2$ (FIG. 10) is producing its output and (2) the signals X and Y when the comparator $MC_1$ is producing its output. The capacitor $C_{111}$ performs such a smoothing operation as shown in (3) to ensure that the base voltage $V_B$ of the transistor $T_{107}$ holds it in its on state even in the case of (2) where the signals X and Y are of small duty.

The other muting signal Ma can be derived directly from the output $\overline{Q}$ from the second flip-flop circuit $FF_2'$. Since these signals Ma and Mb are of negative logic, the NAND gate becomes an OR circuit of positive logic. When either one of the muting signals is produced, an output of the level H is provided to turn on the transistor $T_{102}$ (FIG. 7), thus performing the muting operation.

As is evident from the above, with the muting circuit, it is also possible in the digital tuning to perform muting until the outputs from the comparators $MC_1$ and $MC_2$ become of the level H, and even if an unwanted broadcasting frequency is tuned, muting is not interrupted. Since the search tuning is a tuning operation until the next broadcasting frequency is tuned on the way of the tuning operation, when the next broadcasting frequency is tuned, muting may be stopped. In this regard, the output $\overline{Q}$ from the second flip-flop circuit $FF_2'$ can provide a muting signal which complies with the above requirement. Also in the search tuning, where the search control switches $SW_1'$ and $SW_2'$ continue to be closed, even if the broadcasting frequency is tuned, the output Q from the flip-flop circuit $FF_2'$ does not become of the level L and the tuning operation is continued to carry out tuning in the upward or downward direction. In this tuning process, muting is interrupted but the interruption can be avoided by using the output Q from the flip-flop circuit $FF_2'$ after inverting it by an inverter.

As has been described in the foregoing, according to this invention, the comparison of the set value with the receiving (local oscillation) frequency can be achieved with eight bits, and consequently the comparator and the setter can be simplified. Further, in the comparison, the eight bits are divided into two groups of four higher-order bits and four lower-order bits, so that a moderate tuning operation can be easily achieved by reducing the search speed as the tuning point is approached. Moreover, a noise-free tuning operation can be readily obtained by muting in the tuning.

It will be apparent that many modifications and variations may be effected without departing from the scope of the novel concepts of this invention.

What is claimed is:

1. A receiver for performing tuning of a received signal frequency to a desired broadcast signal frequency selected from a receiving frequency band having a lower limit and upper limit, by adjusting the frequency of a local oscillator output generated in said receiver, comprising:

frequency divider means, having stored therein a preset number corresponding to said received signal frequency which in turn corresponds to the lower limit of said receiving frequency band, for receiving and frequency dividing the local oscillator output to produce an output having a binary initial value corresponding to the lower limit of the receiving frequency band when said local oscillator output matches said preset number, and generating an output having increasing binary values respectively corresponding to increasing frequencies within said receiving frequency band, digital setter means for setting said desired broadcast frequency and providing an output corresponding thereto, digital comparator means for comparing the respective outputs from the frequency divider means and the digital setter means to produce a control signal, and control means responsive to said control signal for selectively and gradually increasing or decreasing the frequency of the local oscillator output until the respective outputs from the frequency divider means and the digital setter means coincide, wherein the respective outputs of said frequency divider means and said digital setter means each includes low-order bits and high-order bits, and wherein the digital comparator means includes a first digital comparator for comparing corresponding low-order bits and producing a corresponding output, and a second digital comparator for comparing corresponding high-order bits and producing a corresponding output comprising a control signal, and including means for preventing the first comparator from producing said corresponding output while the second comparator for the high-order bits produces said control signal.

2. A receiver for performing tuning of a received signal frequency to a desired broadcast signal frequency selected from a receiving frequency band having a lower limit and upper limit, by adjusting the frequency of a local oscillator output generated in said receiver, comprising:

frequency divider means, having stored therein a preset number corresponding to said received signal frequency which in turns corresponds to the lower limit of said receiving frequency band, for receiving and frequency dividing the local oscillator output to produce an output having a binary initial value corresponding to the lower limit of the receiving frequency band when said local oscillator output matches said preset number, and generating an output having increasing binary values respectively corresponding to increasing constant frequencies within said receiving frequency band, digital setter means for setting said desired broadcast frequency and providing an output corresponding thereto, digital comparator means for comparing the respective outputs from the frequency divider means and the digital setter means to produce a control signal, and control means responsive to said control signal for selectively and gradually increasing or decreasing the frequency of the local oscillator output until the respective outputs from the frequency divider means and the digital setter means coincide, wherein said receiver includes means responsive to said received signal for producing an audio signal, and an actuable upward search control switch and a downward search control switch for respectively controlling the direction of search of said receiving frequency band, said digital comparator means for comparing the respective outputs from the frequency divider means and the digital setter means additionally producing a digital signal output, said receiver further including a control circuit for producing a respective output in accordance with the operation of said upward search control switch and said downward search control switch, respectively, to produce a search tuning instruction signal output, muting circuit means responsive to either one of said digital signal output of said digital comparator means and said respective output of the control circuit for producing a switching signal, and a switching circuit actuated by the switching signal from the muting circuit means to cut off said audio signal.

3. The receiver according to claim 2, wherein said muting circuit means includes a transistor, a second control circuit, and a gate circuit having two input terminals, one of the input terminals of the gate circuit being connected to said transistor which is turned on by the output from the digital comparator means to produce an output of a low level, and the other input terminal being connected to said second control circuit for cutting off the output from the second control circuit during tuning.

4. The receiver according to claim 3, wherein the second control circuit is a flip-flop circuit.

5. A receiver for performing tuning of a received signal frequency to a desired broadcast signal frequency, selected from a receiving frequency band having a lower limit and upper limit, by adjusting the frequency of a local oscillator output generated in said receiver, comprising:

frequency divider means, having stored therein a preset number corresponding to said received signal frequency which in turn corresponds to the lower limit of said receiving frequency band, for receiving and frequency dividing the local oscillator output to produce an output having a binary initial value corresponding to the lower limit of the receiving frequency band when said local oscillator output matches said preset number, and generating an output having increasing binary values respectively corresponding to increasing constant frequencies within said receiving frequency band, digital setter means for setting said desired broadcast frequency and providing an output corresponding thereto, digital comparator means for comparing the respective outputs from the frequency divider means and the digital setter means to produce a control signal, and control means responsive to said control signal for selectively and gradually increasing or decreasing the frequency of the local oscillator output until the respective outputs from the frequency divider means and the digital setter means coincide, wherein said receiver includes an actuable upward search control switch and a downward search control switch for respectively controlling the direction of search of said receiving frequency band, said receiver further including auto tuner means comprising a first control circuit for producing an output voltage of first polarity in response to actuation of said upward search control switch and of a second polarity opposite to said first polarity in response to actuation of said downward search control switch, a voltage memory device responsive to said output voltage of said first control circuit for producing a further output voltage which varies in an increasing or decreasing direction in accordance with the polarity of said output voltage, and which varies at a rate in proportion to the time of application of said output voltage, said further output voltage of said voltage memory device being provided to said local oscillator for adjustment of the frequency thereof, said auto tuner means further comprising a second control circuit having an output state which is inverted to cut off the output from the first control circuit when a broadcasting signal is received, and first and second switching circuits connected to the first control circuit, and which have a closed position for inverting the output from the first control circuit so as to reverse the direction of frequency search when the search exceeds the upper or lower limit of the broadcasting frequency band, wherein the first and second switching circuits are transistor circuits, said receiver including decoder means responsive to said control signal therefrom, said control signal being a coded signal, for decoding said control signal to provide a decoded signal output, said transistor circuits being respectively supplied with said decoded signal outputs, said decoded signal outputs being indicative of received frequencies outside of the upper and lower limits of the receiving frequency band.

6. A receiver for performing tuning of a received signal frequency to a desired broadcast signal frequency, selected from a receiving frequency band having a lower limit and upper limit, by adjusting the frequency of a local oscillator output generated in said receiver, comprising:

frequency divider means, having stored therein a preset number corresponding to said received signal frequency which in turn corresponds to the lower limit of said receiving frequency band, for receiving and frequency dividing the local oscillator output to produce an output having a binary initial value corresponding to the lower limit of the receiving frequency band when said local oscillator output matches said preset number, and generating an output having increasing binary values respectively corresponding to increasing constant frequencies within said receiving frequency band, digital setter means for setting said desired broadcast frequency and providing an output corresponding thereto, digital comparator means for comparing the respective outputs from the frequency divider means and the digital setter means fo produce a control signal, and control means responsive to said control signal for selectively and gradually increasing or decreasing the frequency of the local oscillator output until the respective outputs from the frequency divider means and the digital setter means coincide, wherein said frequency divider means comprises a cascaded counter arrangement, said frequency divider means including means for determining selection of a frequency-modulated band of operation, and responsive thereto for adapting said cascaded counter arrangement to form a quaternary counter arrangement without feedback.

7. A receiver for performing tuning of a received signal frequency to a desired broadcast signal frequency, selected from a receiving frequency band having a lower limit and upper limit, by adjusting the frequency of a local oscillator output generated in said receiver, comprising:

frequency divider means, having stored therein a preset number corresponding to said received signal frequency which in turn corresponds to the lower limit of said receiving frequency band, for receiving and frequency dividing the local oscillator output to produce an output having a binary initial value corresponding to the lower limit of the receiving frequency band when said local oscillator output matches said preset number, and generating an output having binary values respectively corresponding to increasing constant frequencies within said receiving frequency band, digital setter means for setting said desired broadcast frequency and providing an output corresponding thereto, digital comparator means for comparing the respective outputs from the frequency divider means and the digital setter means to produce a control signal, and control means responsive to said control signal for selectively and gradually increasing and decreasing the frequency of the local oscillator output until the respective outputs from the frequency divider means and the digital setter means coincide, wherein said frequency divider means comprises a cascaded counter arrangement, said frequency divider means including means for determining selection of an amplitude-modulated band of operation, in responsive thereto for adapting said cascaded counter arrangement to form a ternary counter arrangement with feedback.

8. A receiver for performing tuning of a received signal frequency to a desired broadcast signal frequency, selected from a receiving frequency band having a lower limit and upper limit, by adjusting the frequency of a local oscillator output generated in said receiver, comprising:

frequency divider means, having stored therein a preset number corresponding to said received signal frequency which in turn corresponds to the lower limit of said receiving frequency band, for receiving and frequency dividing the local oscillator output to produce an output having a binary initial value corresponding to the lower limit of the receiving frequency band when said local oscillator output matches said preset number, and generating an output having increasing binary values respectively corresponding to increasing constant frequencies within said receiving frequency band, digital setter means for setting said desired broadcast frequency and providing an output corresponding thereto, digital comparator means for comparing the respective outputs from the frequency divider means and the digital setter means to produce a control signal, and control means responsive to said control signal for selectively and gradually increasing or decreasing the frequency of the local oscillator output until the respective outputs from the frequency divider means and the digital setter means coincide;

said receiver further including means responsive to said received signal for producing a corresponding amplified and converted intermediate frequency signal, and automatic tuner means responsive to said intermediate frequency signal and to said output of said frequency divider means for generating an automatic tune signal selectively indicating required increasing and decreasing of said frequency of said local oscillator output.

9. The receiver according to claim 8 further including switching circuit means responsive to said automatic tune signals for providing a fixed voltage signal of corresponding respective polarity as an output, and voltage control memory means responsive to said corresponding respective polarity of said fixed voltage signal for providing said control signal for increasing or decreasing said frequency of said local oscillator output.

10. The receiver according to claim 8 including means responsive to said amplified and converted intermediate frequency signal for producing an audio output signal, said automatic tuner means additionally providing a muting signal output, said receiver further including muting means responsive to said muting signal output for interrupting said audio output.

11. The receiver according to claim 8 wherein said output of said frequency divider means comprises a digital signal output, said receiver further including decoder means responsive to said digital output signal of said frequency divider means for decoding same to produce decoded digital output signals, and display means responsive to said decoded digital output signals for displaying said received signal frequency.

12. A receiver for performing tuning of a received signal frequency to a desired broadcast signal frequency, selected from a receiving frequency band having a lower limit and upper limit, by adjusting the frequency of a local oscillator output generated in said receiver, comprising:
   a complement setter for presetting a number corresponding to said received signal frequency which in turn corresponds to the lower limit of said receiving frequency band;
   frequency divider means for receiving and frequency dividing the local oscillator output, said frequency divider means generating an output having a binary initial value when said local oscillator output matches said preset number from complement setter, and generating an output having increasing binary values respectively corresponding to increasing frequencies within said receiving frequency band in connection with said local oscillator output being provided as an input thereafter,
   digital setter means for setting said desired broadcast frequency and producing an output corresponding thereto,
   digital comparator means for comparing the respective outputs from the frequency divider means and the digital setter means to produce a control signal, and
   control means responsive to said control signal for selectively and gradually increasing or decreasing the frequency of the local oscillator output until the respective outputs from the frequency divider means and the digital setter means coincide;
   wherein said output of said frequency divider means comprises a digital signal output, said receiver further including display means comprising a matrix circuit including a plurality of addressable display elements for displaying said received signal frequency, and
   decoder means responsive to said digital signal output of said frequency divider means for decoding same to produce decoded digital output signals comprising an address input to said matrix circuit, whereby one of said addressable display elements is addressed for display of said received signal frequency.

13. The receiver according to claim 12, wherein said display elements of said matrix circuit are arranged in a plurality of rows and columns, and said digital signal output of said frequency divider means comprises a first plurality of bits and a second plurality of bits, said decoder means comprising a first decoder responsive to said first plurality of bits for selecting one of said plurality of rows, and a second decoder responsive to said second plurality of bits for selecting one of said plurality of columns, whereby to address said one of said addressable display elements.

14. A receiver for receiving and tuning to a broadcast signal, comprising:
   means responsive to said received broadcast signal for producing an intermediate frequency signal,
   a tuning circuit having a variable reactance element for producing a local oscillator output,
   a tuning voltage generator responsive to a search signal for applying a variable control voltage to said variable reactance element to vary said local oscillator output so as to search a receiving frequency,
   a counter for counting in accordance with said local oscillator output from said tuning circuit and having an output corresponding thereto,
   a digital setter for presetting a desired broadcast frequency and having an output corresponding thereto,
   digital comparator means for comparing the outputs from said digital setter and said counter with each other and providing a comparison output,
   search control means responsive to a start signal and to the comparison output for generating said search signal for said tuning voltage generator,
   search control switch means for producing as an output said start signal to start the search signal generation of said search control means,
   circuit means for producing as an output a stop signal to stop the search signal generation of said search control means upon reception of said broadcast signal, and
   means for converting said intermediate frequency signal from said producing means to an audio signal;
   said receiver further comprising, in combination:
   control circuit means responsive to the signal outputs from said search control means and said circuit means for producing a control output;
   muting circuit means responsive to at least one of the comparison output and the control output for producing a switching signal; and
   switching circuit means actuated by said switching signal from said muting circuit means for cutting off said audio signal.

15. The receiver according to claim 14, wherein said muting circuit means includes a transistor, and a gate circuit having two input terminals, one of the input terminals of said gate circuit being connected to said transistor, said transistor being connected to said comparison output so as to be turned on thereby, so as to produce an output of a low level, and the other input terminal being connected to said control output of said control circuit means.

16. The receiver according to claim 15, wherein the control circuit means comprises a flip-flop circuit.

17. A receiver which receives a broadcast signal, and which is tunable to a receiving frequency within a receiving frequency band having an upper limit and a lower limit, said receiver comprising:
   a tuning circuit having a variable reactance element and a local oscillator which produces a local oscillator output, a tuning voltage generator for applying a variable control voltage to said variable reactance element to search the receiving frequency, an actuable upward search control switch and an actuable downward search control switch for producing respective outputs to control the direction of frequency search of said receiving frequency band, search control means responsive to the respective outputs from said upward and downward search control switches for generating an upward or downward search signal to selectively increase or decrease the receiving frequency, and control means for producing a stop signal to stop the search signal generation of said search control means upon reception of a broadcast signal;

said receiver further comprising, in combination:

binary coder means for coding said local oscillator output from said local oscillator included in said tuning circuit to produce a coded signal output;

decoder means for decoding the coded signal output from said binary coder means to provide decoded signal outputs, said decoded signal outputs being indicative of received frequencies outside of the upper and lower limits of the receiving frequency band; and switching circuit means selectively responsive to the decoded signal outputs for generating a search direction switching signal, said search control means being responsive thereto for selectively changing from said upward to said downward, or from said downward to said upward, searching.

18. A radio receiver for receiving and tuning to a broadcast signal in accordance with a search start operation and a direction of search of a receiving frequency band, said receiver comprising a tuning circuit which includes a variable reactance element and being tunable to said broadcast signal, said receiver producing an intermediate frequency output when said tuning circuit is tuned to said broadcast signal, and wherein a variable control voltage is applied to said variable reactance element included in said tuning circuit to control said receiving frequency within a receiving frequency band having an upper limit and a lower limit, said radio receiver comprising, in combination:

actuable upward search control switch means and downward search control switch means for respectively controlling the search start operation and the direction of search of said receiving frequency band;

a first flip-flop having two input terminals and two output terminals, one of the input terminals being connected to said upward search control switch means and the other to said downward search control switch means, said first flip-flop providing as an output an upward search control signal from one of the two output terminals of said first flip-flop when said upward control switch means operates, and providing as an output a downward search control signal from the other of the two output terminals of said first flip-flop when said downward search control switch means operates;

control circuit means for producing an output voltage of a first polarity in response to the upward search control signal output from said first flip-flop and an output of a second polarity opposite to said first polarity in response to the downward search control signal output from said first flip-flop;

a voltage memory device responsive to said output voltage from said control circuit means for producing a further output voltage which varies in an increasing or decreasing direction in accordance with the polarity of said output voltage so as to comprise said variable control voltage, and which varies at a rate in proportion to the time of application of said output voltage;

search control circuit means for generating a signal for stopping the search operation by the detection of said intermediate frequency output which is produced when said tuning circuit is tuned to said broadcast signal;

a second flip-flop having two input terminals, one of the input terminals being connected in common to said upward and downward search control switch means, and the other being connected to said search control circuit means, the output state of said second flip-flop being switched between first and second states by the signal outputs which are selectively applied to said input terminals from said upward and downward search control switch means and said search control circuit means;

circuit means responsive to the first output state of said second flip-flop for cutting off the search signal output from said first flip-flop, the first output state of said second flip-flop being provided when said second flip-flop is supplied at said other input terminal with the signal output from said search control circuit means;

first switching circuit means connected to said other input terminal of said first flip-flop for automatically switching the direction of search to the downward direction when the frequency search exceeds the upper limit of said receiving frequency band; and second switching circuit means connected to said one input terminal of said first flip-flop for automatically switching the direction of search to the upward direction when the frequency search exceeds the lower limit of said receiving frequency band.

19. A receiver for receiving and tuning to a broadcast signal, comprising:

means responsive to said received broadcast signal for producing an intermediate frequency signal, a tuning circuit having a variable reactance element, a tuning voltage generator responsive to a search signal for applying a variable control voltage to said variable reactance element to search a receiving frequency, search control means responsive to a start signal for generating said search signal for said tuning voltage generator, search control switch means for generating said start signal to start the search signal generation of said search control means, circuit means for generating a stop signal to stop the search signal generation of said search control means upon reception of said broadcast signal, and means for converting said intermediate frequency signal from said producing means to an audio signal;

said receiver further comprising, in combination:

control circuit means responsive to the signal outputs from said search control means and said circuit means for producing a control output;

muting circuit means responsive to the output from said control circuit means for producing a switching signal; and switching circuit means actuated by the switching signal from said muting circuit means for cutting off said audio signal.

20. A receiver for tuning a received broadcast signal to a receiving frequency to produce an intermediate frequency signal, said receiver comprising, in combination:

a tuning circuit having a variable reactance element and a local oscillator generating a local oscillator output, and adapted to be tunable to said receiving frequency within a receiving frequency band having an upper limit and a lower limit, tuning voltage generator means responsive to a search signal for applying a variable control voltage to said variable reactance element to search the receiving frequency, search control means responsive to a start signal for generating said search signal for said tuning voltage generator means, search control switch means for generating said start signal to start the search signal generation of said search control means, circuit means for generating a stop signal to stop the search signal generation of said search control means upon reception of a broadcast signal, and means for converting said intermediate frequency signal from said tuning circuit to an audio signal;

said receiver further comprising, in combination:

a complement setter for presetting a received signal frequency corresponding to the lower limit of said receiving frequency band;

frequency divider means for frequency dividing said local oscillator output from said local oscillator included in said tuning circuit, said frequency divider means having stored therein the present received signal frequency of said complement setter and generating a digital output signal having a binary initial value when said oscillator output matches with said preset received signal frequency, and generating outputs having increasing binary values respectively corresponding to increasing constant frequencies within said receiving frequency band in connection with said oscillator output being provided as an input to said frequency divider means thereafter;

decoder means responsive to the digital output signal from said frequency divider means for decoding it to produce decoded digital output signals; and display means responsive to said decoded digital output signals for displaying said received signal frequency.

21. A receiver for tuning a received broadcast signal to a receiving frequency to produce an intermediate frequency signal, said receiver comprising, in combination:

a tuning circuit having a variable reactance element and a local oscillator generating a local oscillator output, tuning voltage generator means responsive to a search signal for applying a variable control voltage to said variable reactance element to search said receiving frequency, counter means for counting said local oscillator output from said tuning circuit to produce a counter output, digital setter means for preselecting a desired broadcast frequency and producing a corresponding output, digital comparator means for comparing the outputs from said digital setter means and said counter means and producing a comparison output, control means responsive to the comparison output from said digital comparator means for generating said search signal for said tuning voltage generator means, and means for converting said intermediate frequency signal to an audio signal;

said receiver further comprising, in combination:

muting circuit means responsive to the comparison output from said digital comparator means for producing a switching signal; and switching circuit means actuated by the switching signal from said muting circuit means for cutting off said audio signal.

22. A receiver for performing tuning of a received signal frequency to a desired broadcast signal frequency, selected from a receiving frequency band having a lower limit and upper limit, by adjusting the frequency of a local oscillator output generated in said receiver, comprising:

a complement setter for presetting a number corresponding to said received signal frequency which in turn corresponds to the lower limit of said receiving frequency band;

frequency divider means for receiving and frequency dividing the local oscillator output, said frequency divider means having stored therein the preset number of said complement setter and generating an output having a binary initial value when said local oscillator output matches said preset number from said complement setter, and generating an output having increasing binary values respectively corresponding to increasing frequencies within said receiving frequency band, digital setter means for setting said desired broadcast frequency and producing an output corresponding thereto, digital comparator means for comparing the respective outputs from the frequency divider means and the digital setter means to produce a control signal, and control means responsive to said control signal for selectively and gradually increasing or decreasing the frequency of the local oscillator output until the respective outputs from the frequency divider means and the digital setter means coincide;

said receiver further including auto tuner means comprising:

actuable upward search control switch means and downward search control switch means for respectively controlling the search start operation and the direction of search of said receiving frequency band, a first flip-flop having two input terminals and two output terminals, one of the input terminals being connected to said upward search control switch means and the other to said downward search control switch means, said first flip-flop providing as an output an upward search control signal from one of the output terminals of said first flip-flop when said upward control switch means operates, and providing as an output a downward search control signal from the other output terminal of said first flip-flop when said downward search control switch means operates, control circuit means for producing an output voltage of a first polarity in response to the upward search control signal output from said first flip-flop and an output of a second polarity opposite to said first polarity in response to the downward search control signal output from said first flip-flop, a voltage memory device responsive to said output voltage from said control circuit means for producing a further output voltage which varies in an increasing or decreasing direction in accordance with the polarity of said output voltage, and which varies at a rate in proportion to the time of application of said output voltage, said further output voltage of said voltage memory device being provided to said local oscillator for adjustment of the frequency thereof, search control circuit means for generating a signal for stopping the search operation by the detection of said intermediate frequency output which is produced when a broadcasting signal is received, a second flip-flop having two input terminals, one of the input terminals being connected in common to said upward and downward search control switch means, and the other being connected to said search control circuit means, the output state of said second flip-flop being switched between first and second states by the signal outputs which are selectively applied to said input terminals from said upward and downward search control switch means and said search control circuit means, circuit means responsive to the first output state of said second flip-flop for cutting off the search signal output from said first flip-flop, the first output state of said second flip-flop being provided when said second flip-flop is supplied at said other input terminal with the signal output from said search control circuit means, first switching circuit means connected to said other input terminal of said first flip-flop for automatically switching the direction of search to the downward direction when the frequency search exceeds the upper limit of said receiving frequency band, and second switching circuit means connected to said one input terminal of said first flip-flop for automatically switching the direction of search to the upward direction when the frequency search exceeds the lower limit of said receiving frequency band.

* * * * *

UNITED STATES PATENT AND TRADEMARK OFFICE
CERTIFICATE OF CORRECTION

PATENT NO. : 4,207,529

DATED : June 10, 1980

INVENTOR(S) : Yuji Amaya et al.

It is certified that error appears in the above—identified patent and that said Letters Patent is hereby corrected as shown below:

Col. 1, line 23, "storing" should be --stopping--;

Col. 1, line 24, after "tuning)" insert --can--;

Col. 1, line 37, "use," should be --use can be--;

Col. 1, line 38, after "which" delete --,--;

Col. 1, line 39, after "which" insert --,--;

Col. 4, line 6, after "that is" insert --,--;

Col. 5, line 51, in heading at top of first column of "Table 1," "F" should be --f--;

Col. 6, line 4, in heading at top of first column of "Table 1-continued", "F" should be --f--;

Col. 6, line 59, "$D_{9L}$ and D10" should be --$D_9$ and $D_{10}$--;

*Col. 8, line 60, "above-said" should be --abovesaid--;

*Col. 9, line 54, "[(77∽90)-10.7]KHz" should be ----[(76∽90)-10.7]MHz--;

Col. 10, line 11, "$1_{11}$" should be --$\ell_{11}$--, "$1_{15}$" should be --$\ell_{15}$--;

Col. 10, line 15, "$1_{21}$" should be --$\ell_{21}$--, "$1_{28}$" should be --$\ell_{28}$--;

UNITED STATES PATENT AND TRADEMARK OFFICE
CERTIFICATE OF CORRECTION

PATENT NO. : 4,207,529
DATED : June 10, 1980
INVENTOR(S) : Yuji Amaya et al.

It is certified that error appears in the above-identified patent and that said Letters Patent are hereby corrected as shown below:

Col. 10, line 26, "$1_{21}$" should be --$\ell_{21}$--, "$1_{28}$" should be --$\ell_{28}$--;

Col. 10, line 28, "$1_{11}$" should be --$\ell_{11}$--, "$1_{15}$" should be --$\ell_{15}$--;

Col. 10, line 45, "$1_{22}$" should be --$\ell_{22}$--, "$1_{11}$" should be --$\ell_{11}$--;

Col. 10, line 47, "$1_{25}$" should be --$\ell_{25}$--;

Col. 10, line 48, "$1_{15}$" should be --$\ell_{15}$--;

Col. 10, line 50, "$1_{11}$" should be --$\ell_{11}$--, "$1_{21}$" should be --$\ell_{21}$--;

Col. 10, line 51, "$1_{15}$" should be --$\ell_{15}$--, "$1_{26}$" should be --$\ell_{26}$--;

Col. 10, line 52, "corresponds" should be --correspond--;

*Col. 11, line 26, "(At" should be --(at--, "off.)," should be --off),--;

Col. 11, line 61, "SWS" should be --$SW_5$--;

UNITED STATES PATENT AND TRADEMARK OFFICE
CERTIFICATE OF CORRECTION

PATENT NO. : 4,207,529            Page 3 of 4

DATED : June 10, 1980

INVENTOR(S) : Yuji Amaya et al.

It is certified that error appears in the above-identified patent and that said Letters Patent are hereby corrected as shown below:

Col. 13, line 39, "$1_{11}$" should be --$\ell_{11}$--, "$1_{15}$" should be --$\ell_{15}$--;

Col. 13, line 41, "gate, as shown $AG_1$." should be --gates $AG_1$, as shown.--;

Col. 13, line 42, "$1_{21}$" should be --$\ell_{21}$--, "$1_{28}$" should be --$\ell_{28}$--;

*Col. 14, line 14, delete "the";

Col. 14, line 40, "Tg" should be --Tq--;

Col. 14, line 55, "$FF_1$, and $FF_2$," should be --$FF_1$' and $FF_2$'--;

Col. 14, line 58, "$FF_1$," should be --$FF_1$'--;

Col. 14, line 68, "$FF_2$," should be --$FF_2$'--;

Col. 15, line 56, "demuting" should be --the muting--;

Col. 16, line 47, after "frequency" insert --,--;

*Col. 17, line 10, "includes" should be --include--;

Col. 17, line 22, after "frequency" insert --,--;

UNITED STATES PATENT AND TRADEMARK OFFICE
CERTIFICATE OF CORRECTION

PATENT NO. : 4,207,529

DATED : June 10, 1980

INVENTOR(S) : Yuji Amaya et al.

It is certified that error appears in the above-identified patent and that said Letters Patent are hereby corrected as shown below:

Col. 17, line 29, "turns" should be --turn--;

*Col. 19, line 8, after "band," insert --and--;

Col. 19, line 42, "fo" should be --to--;

Col. 20, line 22, "in" should be --and--;

Col. 22, line 5, before "one" insert --at least--;

Signed and Sealed this

Eleventh Day of November 1980

[SEAL]

Attest:

SIDNEY A. DIAMOND

Attesting Officer

Commissioner of Patents and Trademarks